United States Patent [19]

Tesch

[11] Patent Number: 5,790,060

[45] Date of Patent: Aug. 4, 1998

[54] DIGITAL-TO-ANALOG CONVERTER HAVING ENHANCED CURRENT STEERING AND ASSOCIATED METHOD

[75] Inventor: Bruce J. Tesch, Melbourne, Fla.

[73] Assignee: Harris Corporation, Palm Bay, Fla.

[21] Appl. No.: 714,019

[22] Filed: Sep. 11, 1996

[51] Int. Cl.[6] .................................................. H03M 1/06
[52] U.S. Cl. ......................... 341/119; 341/144; 341/145
[58] Field of Search ............................. 341/118, 119, 341/144, 145, 153, 154

[56] References Cited

U.S. PATENT DOCUMENTS

| | | | |
|---|---|---|---|
| 3,961,326 | 6/1976 | Craven | 340/347 |
| 4,458,201 | 7/1984 | Koen | 323/317 |
| 4,607,248 | 8/1986 | Botka et al. | 340/347 |
| 4,683,458 | 7/1987 | Hallgren | 340/347 |
| 4,879,505 | 11/1989 | Barrow et al. | 323/312 |
| 4,899,152 | 2/1990 | Barrow et al. | 341/154 |
| 5,030,924 | 7/1991 | Fritz | 330/256 |
| 5,043,730 | 8/1991 | Obinata | 341/153 |
| 5,055,847 | 10/1991 | Rybicki et al. | 341/162 |
| 5,162,674 | 11/1992 | Allstot et al. | 307/451 |
| 5,321,401 | 6/1994 | White | 341/147 |
| 5,396,133 | 3/1995 | Zhang | 327/434 |
| 5,420,529 | 5/1995 | Guay et al. | 326/115 |
| 5,463,394 | 10/1995 | Sun | 341/136 |
| 5,483,150 | 1/1996 | Elliott et al. | 323/312 |
| 5,612,697 | 3/1997 | Mercer | 341/153 |
| 5,672,961 | 9/1997 | Entrikin et al. | 323/315 |

OTHER PUBLICATIONS

Tien-Yu Wu et al., "A Low Glitch 10-bit 75-MHz CMOS Video D/A Converter", *IEEE J. Solid-State Circuits*, vol. 30/1, Jan. 1995.

Cornelis A.A. Bastiaansen et al., "A 10-b 40-MHz 0.8-μm CMOS Current-Output D/A Converter", *IEEE J. Solid-State Circuits*, vol. 26/7, Jul. 1991.

Douglas Mercer, "A 16-b D/A Converter With Increased Spurious Free Dynamic Range", *IEEE J. Solid-State Circuits*, vol. 29/10, Oct. 1994.

*Primary Examiner*—Jeffrey A. Gaffin
*Assistant Examiner*—Kim N. Huynh
*Attorney, Agent, or Firm*—Allen, Dyer, Doppelt, Milbrath & Gilchrist, P.A.

[57] ABSTRACT

A digital-to-analog converter includes a plurality of current cells, at least one cell in one embodiment including a pair of bipolar current switching transistors connected to a current source and a current summing bus in a current steering configuration so that one transistor is off while the other transistor is on. A temperature compensated control circuit is included for controlling the difference in base-emitter voltages of the bipolar current switching transistors based upon a temperature dependent bias voltage to compensate for a thermal voltage of the bipolar transistors. The temperature compensated control circuit preferably comprises a proportional to absolute temperature (PTAT) current source, and a steering pair of transistors connected to the PTAT current source and the pair of bipolar current switching transistors. The PTAT current source and steering transistors effectively bias the current switching transistors to account for the thermal voltage of the bipolar transistors. Method aspects of the invention are also disclosed.

30 Claims, 3 Drawing Sheets

DIGITAL-TO-ANALOG CONVERTER HAVING ENHANCED CURRENT STEERING AND ASSOCIATED METHOD

FIELD OF THE INVENTION

The present application relates to the field of electronic circuits, and more particularly, to a digital-to-analog converter (DAC) and method for operating the DAC.

BACKGROUND OF THE INVENTION

Digital-to-analog converters are widely used for converting digital signals to corresponding analog signals for many electronic circuits. For example, a high resolution, high speed digital-to-analog converter (DAC) may find applications in cellular base stations, wireless communications, direct digital frequency synthesis, signal reconstruction, test equipment, high resolution imaging systems and arbitrary waveform generators, for example.

An integrated circuit DAC is described, for example, in U.S. Pat. No. 3,961,326 to Craven entitled "Solid State Digital to Analog Converter". The DAC includes binarily scaled constant current sources with associated switch cells employing bipolar transistors to direct the bit currents either to a current summing bus or to ground. Each of the switch cells includes a first differential transistor pair driving a second differential pair of current switching transistors.

Unfortunately when a DAC switches from one code to the next there typically exists some asymmetry in the speed that the bit switch turns on and turns off. This results in the output of the DAC going in the wrong direction for a short time until all of the switches have fully switched. The resulting error or glitch in the output is code dependent and thus produces harmonic distortion or other nonharmonic spurs in the output spectrum. Glitch is often tested at the major carry of the DAC and there will be a spike in the output as the DAC switches. Glitch is typically considered as the net area under that spike.

There have been attempts to further reduce glitch in a DAC and thereby reduce harmonic distortion and other spurs in the output spectrum. For example, a DAC for video applications is disclosed in an article entitled "A Low Glitch 10-bit 75-MHz CMOS Video D/A Converter" by Wu et al. in the IEEE Journal of Solid-State Circuits, Vol. 30, No. 1, January 1995. The DAC includes a segmented antisymmetric switching sequence and an asymmetrical switching buffer. The DAC includes a large number of non-weighted current sources for the seven most significant bits, and weighted current sources for the three least significant bits. The current sources may be nonuniform for various reasons, such as layout mismatch, thermal distribution, and process deviation. A segmented antisymmetric switching sequence is disclosed to suppress the superposition of graded error, symmetrical error, and especially random error. The current cell includes a cascode current source and an asymmetrical switching buffer. The asymmetrical switch control avoids simultaneously turning off the differential switching transistors completely, but allow simultaneous turn-on for a short period of time. The current cell is disclosed as producing a glitch error of less than about 3.9 pVs.

Another DAC is disclosed in an article by Bastiaansen et al. entitled "A 10-b 40-MHz 0.8-um CMOS Current-Output D/A Converter" in IEEE Journal of Solid-State Circuits, Vol. 26, No. 7, July 1991. The DAC is based on current division and current switching. Monotonicity of the converter requires that the integral nonlinearity (INL) be less than ±0.5 LSB. Unfortunately, this places high demands on upon the matching of the current sources. Ten binary-weighted currents have to be generated. These currents are generated by a combination of 1024 equally sized MOS current sources. To reduce the influence of the output capacitance of the current sources, cascode stages are added. The ten binary-weighted currents are switched to either the output rail or the dump rail by two way current switches. The current switches are connected to the outputs of level-shift stages, which, in turn, are controlled by the digital input data stored in a data register.

An article entitled "A 16-b D/A Converter with Increased Spurious Free Dynamic Range" by Mercer in the IEEE Journal of Solid-State Circuits, Vol. 29, No. 10, October 1994, pp. 1180–1185 discloses another DAC. The article identifies the two broad categories of errors or distortion in digital-to-analog conversion. Segmentation of the bits and laser trimming of thin film resistors are often used to minimize static errors. Dynamic or AC errors include nonlinear settling, ringing, nonsymmetric slew, and glitch. Thermometer decoding of the most significant bits along with high-speed process technologies are often employed to minimize the dynamic errors. Segmentation of the four most significant bits into 15 currents of equal sized is disclosed. An R/2R ladder is used with the 12 current sources for the least significant bits. Laser trimmable thin-film resistors are used in the DAC current sources to allow trimming to reduce linearity errors.

Unfortunately, despite continued improvements in DAC accuracy and operating speed, errors may still significantly effect linearity of the DAC. For example, non-linearities may arise from insufficient current steering between the current switching transistors particularly over a relatively wide operating temperature. In other words, particularly for bipolar current switching transistors, the current through the off transistor may be relatively high at higher temperatures thereby reducing linearity.

SUMMARY OF THE INVENTION

In view of the foregoing background, it is therefore an object of the present invention to provide a digital-to-analog converter and related method for having high accuracy and linearity over a relatively wide operating temperature.

These and other objects, advantages and features of the present invention are provided by a digital-to-analog converter comprising a plurality of current cells, at least one cell including a pair of bipolar current switching transistors connected to a current source and a current summing bus in a current steering configuration so that one transistor is off while the other transistor is on, and temperature compensated control means for controlling a difference in base emitter voltages of the bipolar current switching transistors based upon a temperature dependent bias voltage to compensate for a thermal voltage of the bipolar transistors.

The temperature compensated control means preferably comprises a proportional to absolute temperature (PTAT) current source, and a pair of steering transistors and associated bias resistors connected to the PTAT current source and the pair of bipolar current switching transistors. The PTAT current source and steering transistors effectively bias the current switching transistors to account for the thermal voltage of the bipolar transistors so that a predetermined high degree of current steering can be achieved over a relatively wide temperature range and while using a relatively low differential control voltage dependent on the temperature.

A buffer stage may be connected between the pair of steering transistors and the pair of current switching transistors. For example, the buffer stage may be provided by a pair of buffer transistors and associated constant current sources connected thereto.

The plurality of current cells of the DAC may be arranged in a split architecture with a first group of current cells for a first number of least significant bits and second group of current for a second number of most significant bits. Accordingly, each of the current cells for the second group of current cells may comprise the current source, the pair of bipolar current switching transistors, and the temperature compensated control means as described above. The DAC may also include a resistor network connected between the first group of LSB current cells and the current summing bus.

The DAC may also include a master register receiving the digital inputs, a data buffer and level shifter connected to the master register, and a slave register connected to the data buffer and level shifter. The digital input means preferably further comprises a decoder connected between the data buffer and level shifter and slave register for the second group of current cells for the most significant bits.

The concepts of the present invention may be adapted to a current cell including other than bipolar current switching transistors. For example, the current cell may include temperature compensated control means for controlling the difference in transistor control voltages of the current switching transistors based upon a temperature dependent bias voltage to compensate for the thermally dependent voltage of the transistors.

A method aspect of the present invention is for steering current in a current cell comprising a pair of current switching transistors connected together in a current steering configuration so that one transistor is off while the other transistor is on, and with the pair of current switching transistors having a proportion of current steering based upon a difference in transistor control voltage and also based upon a thermally dependent voltage. The method preferably comprises the steps of: supplying a current to the pair of current switching transistors for steering; and controlling the difference in transistor control voltages of the current switching transistors based upon a temperature dependent bias voltage to compensate for the thermally dependent voltage.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
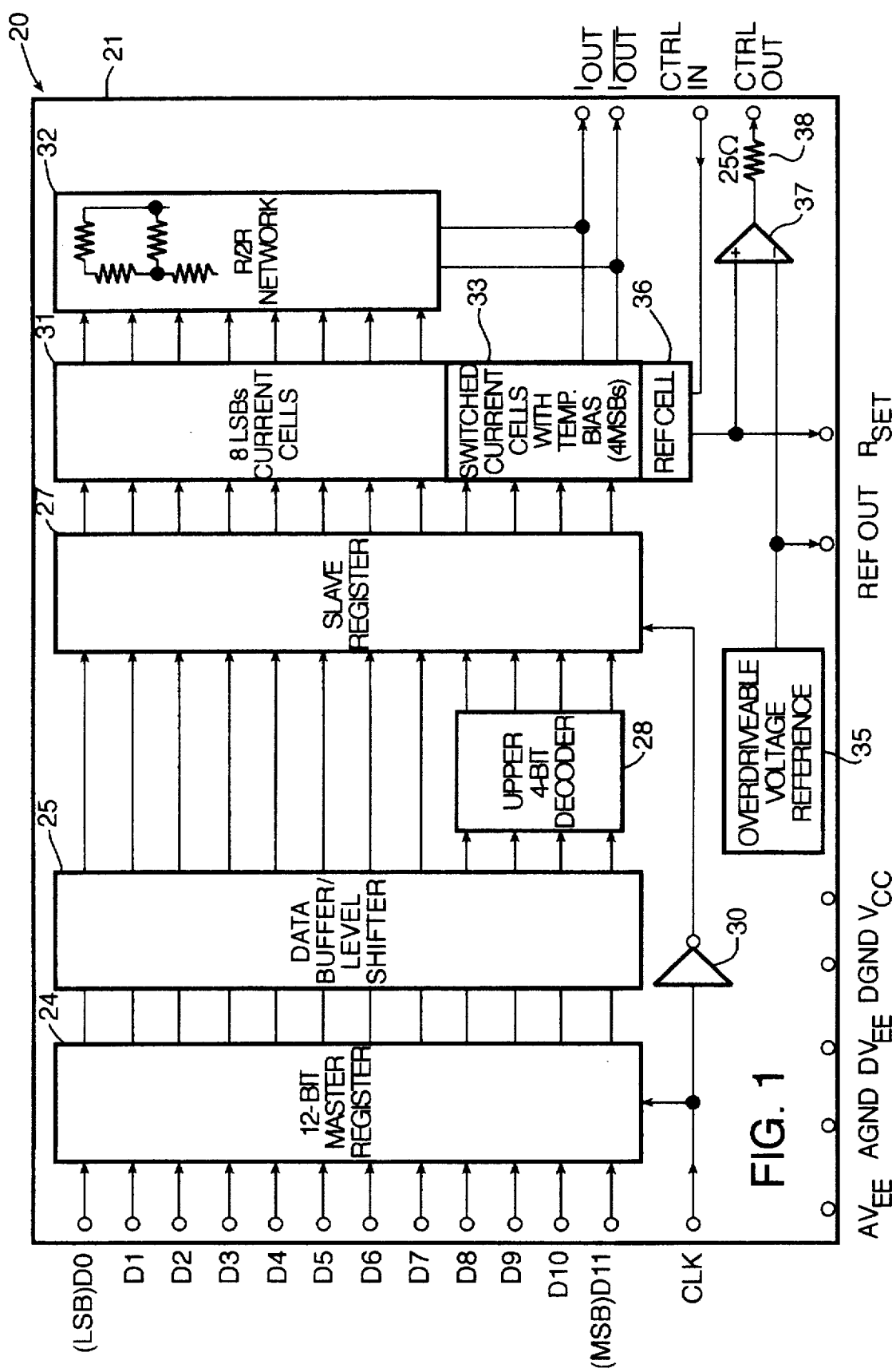
FIG. 1 is a schematic block diagram of a digital-to-analog converter in accordance with the present invention.

Referring to FIG. 1, the integrated circuit digital-to-analog converter (DAC) 20 in accordance with the invention is first described. The illustrated DAC 20 includes a substrate 21 and a plurality of circuit portions for converting a 12-bit digital input to an analog output signal as described in greater detail below.

More particularly, the DAC 20 includes a 12-bit master register 24 for receiving the digital input signals wherein the least significant bit (LSB) is D0 and the most significant bit (MSB) is D11. The 12-bit master register feeds a data buffer/level shifter 25 as would be readily understood by those skilled in the art. The first eight bits from the data buffer/level shifter 25 are connected to the illustrated slave register 27. The upper four bits pass through a 4-bit decoder 28 and provide fifteen outputs to the input of the slave register 27 in the illustrated embodiment. A clock input signal drives the 12-bit master register 24 and drives the slave register 27 via the illustrated inverter 30. A plurality of other terminals are provided including $AV_{EE}$, AGND, $DV_{EE}$, DGND and $V_{CC}$ as illustrated on the lower left hand portion of the schematic diagram of FIG. 1 as would be readily understood by those skilled in the art.

The illustrated DAC 20 includes a split architecture wherein the eight LSBs are directed to a first block of current cells 31 which, in turn, are connected to the illustrated R/2R resistor ladder 32. The four MSBs are directed to the illustrated block of fifteen switched current cells with a temperature bias 33. In slightly different terms, the architecture employs a split R/2R ladder 32 and segmented switching current cell arrangement to reduce glitch. Bits D0 (least significant bit) through D7 may directly drive the typical R/2R network 32 to create the binary weighted current sources. Bits D8 through D11 pass through a so-called thermometer decoder 28 that converts the incoming data into fifteen individual segmented current source enables as would be readily understood by those skilled in the art. This split architecture of the DAC 20 also helps to reduce glitch, thus resulting in a more constant glitch characteristic across the entire output transfer function.

Those of skill in the art will readily appreciate the operation of the illustrated overdriveable voltage reference 35, reference cell 36, amplifier 37, and 25 ohm resistor 38. These circuit portions provide the illustrated reference output REF OUT, reference set $R_{SET}$, control output CTRL OUT, and control input CTRL IN. The reference cell 36 is connected in a feedback configuration using amplifier 37 to establish the precision reference for the switched current cells 31 and 33.

Figure 2:
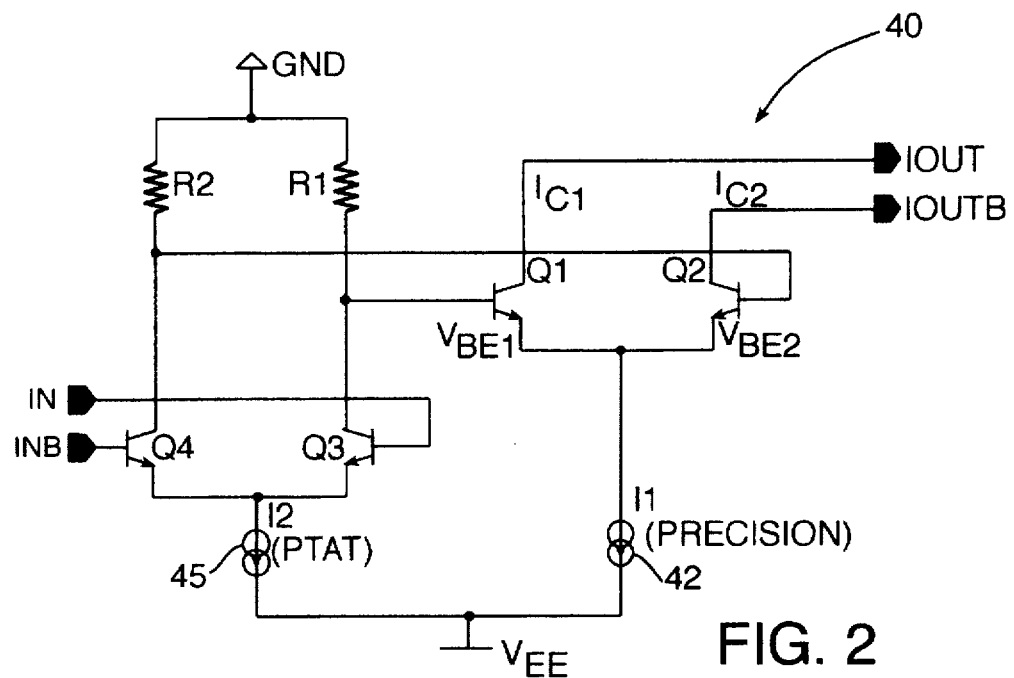
FIG. 2 is a schematic circuit diagram of an embodiment of a switched current cell of the digital-to-analog converter in accordance with the present invention.

Turning now additional to the schematic circuit diagram of FIG. 2 a switched current cell 40 in accordance with the present invention is further described. As will be readily appreciated by those skilled in the art, the current cell 40 is preferably used for at least the block of four MSBs 33, and more preferably for the block of LSBs 31 as well.

The illustrated current cell 40 includes a pair of differentially connected bipolar current switching transistors Q1, Q2 having their emitters connected to the illustrated precision current source 42 for generating the current I1. As would be readily understood by those skilled in the art, the transistors Q1, Q2 are connected in a current steering configuration wherein the transistors are alternately conducting dependent upon the difference in the base-emitter voltages. The two transistors Q1, Q2 may be considered to be oppositely symmetrical wherein when one transistor is on, the other is off, and wherein each has the same low and high values as disclosed in U.S. Pat. No. 3,961,326 to Craven, the entire disclosure of which is incorporated herein by reference in its entirety.

As would be readily understood by those skilled in the art, for the case of bipolar transistors and wherein transistor Q1 is off and transistor Q2 is conducting, the ratio of current steering or IC1/IC2 is given by:

$$I_{C1}/I_{C2} \cong e^{\Delta V_{BE}/V_T}$$

where $\Delta V_{BE}$ is the difference in the base-emitter voltages of the two transistors Q1, Q2, and $V_T$ is the thermal voltage of the transistors. The thermal voltage $V_T$=kT/q where k is Boltzman's constant, T is the absolute temperature, and q is the electronic charge as would be readily appreciated by those skilled in the art.

To provide substantially complete current steering, IC1/IC2 is preferably less than or equal to about 6 parts per million (ppm), for example. Letting the current ratio be equal to 6 ppm in the above equation, the ratio of $\Delta V_{BE}/V_T$ is equal to 12. TABLE 1 below summarizes the desired $\Delta V_{BE}$ for the given operating temperatures and corresponding thermal voltages $V_T$.

TABLE 1

| TEMP (°C.) | $V_T$ (mv) | $\Delta V_{BB}$ (mv) |
|---|---|---|
| 125 | 33 | 400 |
| 25 | 25 | 300 |
| −40 | 20 | 240 |

Most conventional current switches are designed so that at 25° C., 300 mv is used to switch the bipolar transistors Q1, Q2. Unfortunately, at the higher operating temperature of 125° C., the 300 mv signal is insufficient to provide the relatively low 6 ppm error in the current steering ratio. Accordingly, a conventional current switching cell will have increased error at the higher temperature based upon the thermal voltage of the bipolar transistors.

The present invention compensates for the thermal voltage $V_T$ by providing a bias to the base-emitter voltages of the current switching bipolar transistors Q1, Q2 based upon temperature. In particular, the bias is provided via the pair of illustrated differential steering transistors Q3, Q4, resistors R1, R2, and the proportional to absolute temperature (PTAT) current source 45 for providing a current I2 proportional to the absolute temperature. Accordingly, as the temperature increases, the difference in the base-emitter voltages is increased, and vice-versa.

In other words, at 125° C., for example, the PTAT bias scheme will provide a $\Delta V_{BE}$ of 400 mv, and will provide the lower corresponding voltages at the lower temperatures as in TABLE 1 so that the relatively low error based upon the current steering ratio is maintained over the entire desired temperature range.

Figure 3:
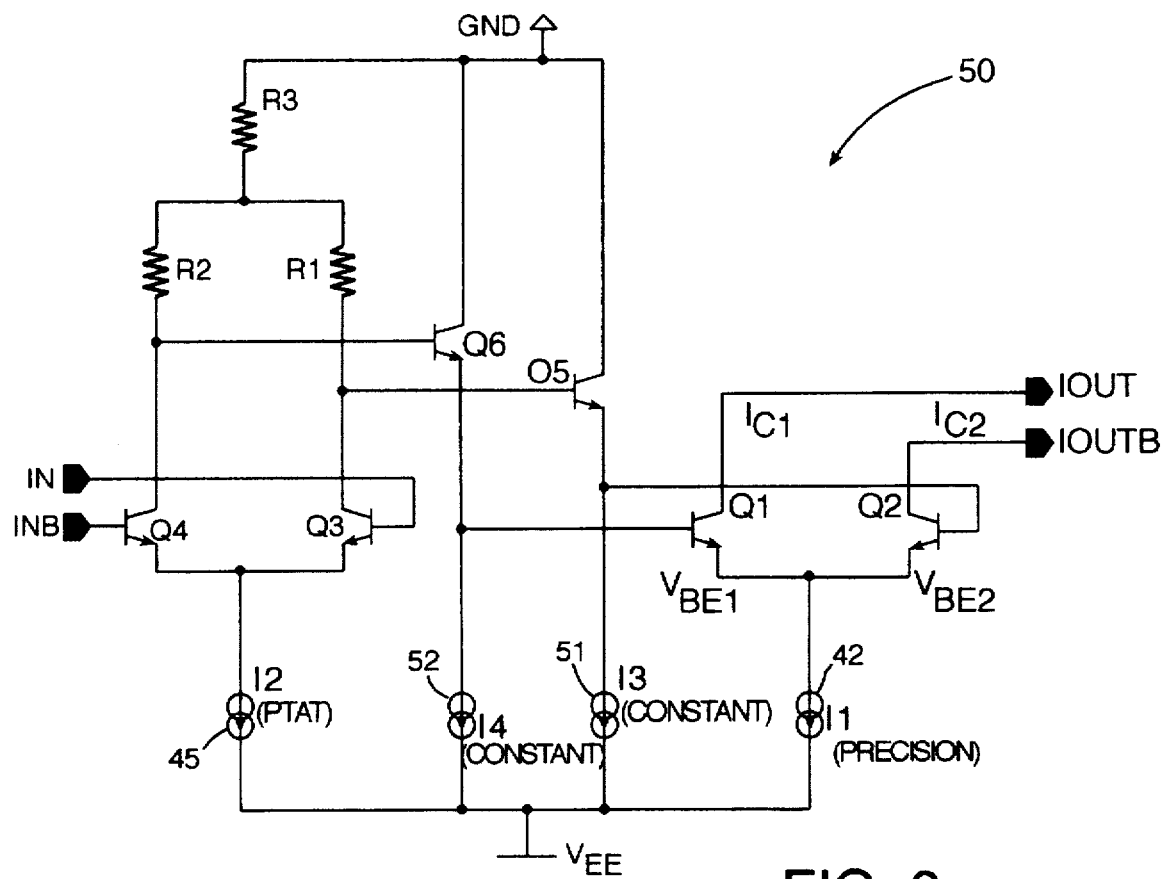
FIG. 3 is a schematic circuit diagram of another embodiment of a switched current cell of the digital-to-analog converter in accordance with the present invention.

A second embodiment of the switched current cell 50 is understood with reference to FIG. 3. This embodiment is similar to that described above with reference to FIG. 2; however, in the embodiment of FIG. 3 a pair of transistors Q5, Q6 are connected in an emitter-follower configuration to serve as buffers between the pair of steering transistors Q3, Q4 and the pair of current switching transistors Q1, Q2 as would be readily appreciated by those skilled in the art. The current cell 50 also includes the illustrated additional bias resistor R3 connected between the two biasing resistors R1, R2 and ground GND. In addition, each of the buffer transistors Q5, Q6 is connected in series with a respective constant current source 51, 52 to provide the constant currents I3, I4. The choice on whether to use the illustrated buffer transistors Q5, Q6 may depend, at least in part, on the desired settling time of the DAC. The PTAT compensation circuit of this embodiment also provides an additional benefit in that the collector-emitter voltage of the current switching transistors Q1, Q2 is maintained at a higher level at higher temperatures than would otherwise be provided if I2 were constant, for example. Operation of the second embodiment of the current cell 50 is similar to that of the first embodiment and needs no further description herein.

Figure 4:
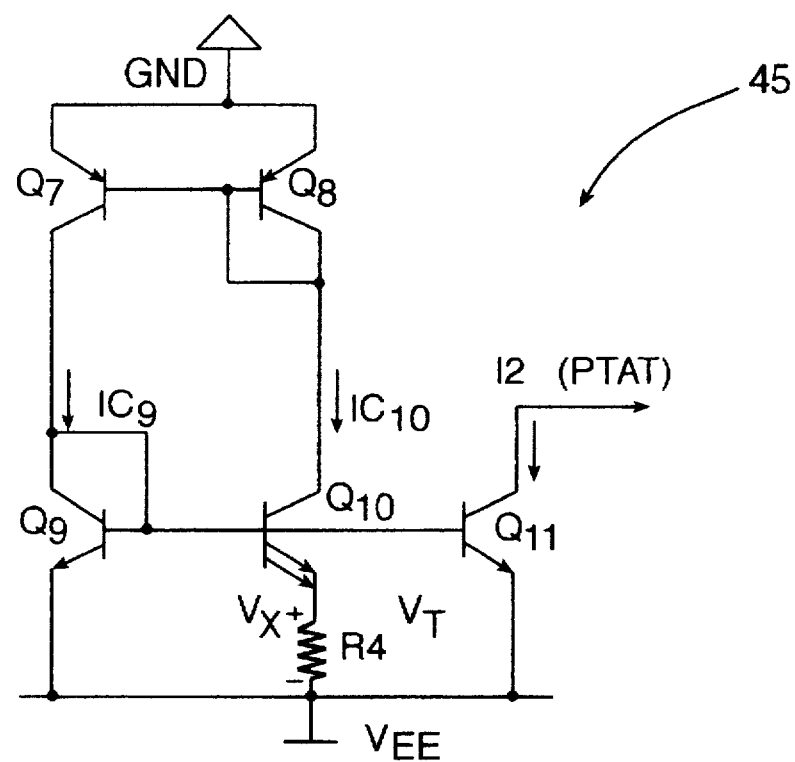
FIG. 4 is a schematic circuit diagram of a PTAT current source portion of the current cell of the digital-to-analog converter in accordance with the present invention.

The PTAT current source 45 may be provided by any number of well-known circuits as would be readily understood by those skilled in the art. FIG. 4 illustrates a PTAT current source 45 which may be used in the current cells in accordance with the present invention. The illustrated PTAT current source 45 is based upon the PTAT source disclosed in "Design of Analog Integrated Circuits" by Gray et al., pp. 282–283, published by John Wiley & Sons (1984).

In particular, the collector currents $I_{C9}$ and $I_{C10}$ may be constrained to be equal by the current source formed by transistors Q7, Q8. Transistor Q11 provides a current mirror to generate the PTAT current output I2 (FIGS. 2 and 3) as would be readily understood by those skilled in the art. In addition, the bias resistors R1–R3 are desirably made from the same material as R4 so that any temperature coefficient effects of the resistors are substantially cancelled out as would also be readily understood by those skilled in the art.

A method aspect of the present invention is for steering current in a current cell 40, 50 comprising a pair of current switching transistors Q1, Q2 connected together in a current steering configuration so that one transistor is off while the other transistor is on, and with the pair of current switching transistors having a proportion of current steering based upon a difference in transistor control voltage and also based upon a thermally dependent voltage. The method preferably comprises the steps of: supplying a current to the pair of current switching transistors Q1, Q2 for steering; and controlling the difference in transistor control voltages of the current switching transistors based upon a temperature dependent bias voltage to compensate for the thermally dependent voltage. The difference in control voltages may be provided using a pair of steering transistors Q3, Q4 and associated bias resistors R1, R2 supplied current from a PTAT current source 45 as described above.

Those of skill in the art will readily appreciate that the DAC embodiments of the present invention may find uses in many applications including cellular base stations, wireless communications, direct digital frequency synthesis, signal reconstruction, test equipment, high resolution imaging systems and arbitrary waveform generators, for example. Those of skill in the art will also recognize that a current cell 40, 50 as described herein can be readily implemented using PNP bipolar transistors, for example, rather than the illustrated NPN transistors. The switching current cells may also be used in electronic circuits other than the illustrated DAC.

Moreover, the concept of a temperature responsive bias to correct for the temperature dependence of current switching transistors may also be applied to metal oxide semiconductor (MOS) transistors, although the temperature relationship is somewhat more complicated than for the bipolar transistors as would be readily understood by those skilled in the art. Bipolar transistors may also offer an advantage for certain current steering applications because of the relatively large transconductance of bipolar transistors as compared, for example, with similar MOS devices.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A digital-to-analog converter comprising:
   digital input means for receiving a plurality of digital input signals;
   at least one output current summing bus; and
   a plurality of current cells connected to said digital input means and said at least one output current summing bus, at least one of said current cells comprising
      a current source,
      a pair of bipolar current switching transistors connected to said current source and said at least one output current summing bus in a current steering configuration so that one transistor is off while the other transistor is on, said pair of bipolar current switching transistors having a proportion of current steering based upon a difference in base-emitter voltages and also based upon a thermal voltage, and
      temperature compensated control means for controlling the difference in base-emitter voltages of said bipolar current switching transistors based upon a temperature dependent bias voltage to compensate for the thermal voltage.

2. A digital-to-analog converter according to claim 1 wherein said temperature compensated control means comprises means for controlling the difference in base-emitter voltages of said bipolar current switching transistors to provide a predetermined proportion of current steering over a relatively wide temperature range.

3. A digital-to-analog converter according to claim 1 wherein said temperature compensated control means comprises proportional to absolute temperature (PTAT) control means for controlling the difference in base-emitter voltages of said bipolar current switching transistors based upon absolute temperature.

4. A digital-to-analog converter according to claim 3 wherein said PTAT control means comprises:
   a PTAT current source; and
   a pair of steering transistors and associated bias resistors connected to said PTAT current source and said pair of bipolar current switching transistors.

5. A digital-to-analog converter according to claim 4 wherein said temperature compensated control means further comprises a buffer stage connected between said pair of steering transistors and said pair of current switching transistors.

6. A digital-to-analog converter according to claim 4 wherein each of said pair of steering transistors comprises a bipolar transistor.

7. A digital-to-analog converter according to claim 5 wherein said buffer stage comprises a pair of buffer transistors and associated constant current sources connected thereto.

8. A digital-to-analog converter according to claim 1 wherein the plurality of current cells are arranged in a split architecture with a first group of current cells for a first number of least significant bits and a second group of current cells for a second number of most significant bits.

9. A digital-to-analog converter according to claim 8 further comprising a resistor network connected between the first group of current cells and the at least one current summing bus.

10. A digital-to-analog converter according to claim 8 wherein said digital input means comprises:
    a master register receiving the digital input signals;
    a data buffer and level shifter connected to said master register; and
    a slave register connected between said data buffer and level shifter and said plurality of current cells.

11. A digital-to-analog converter according to claim 10 wherein said digital input means further comprises a decoder connected between said data buffer and level shifter and said slave register for the second group of current cells for the second number of most significant bits.

12. A digital-to-analog converter according to claim 1 wherein the emitters of said pair of bipolar current switching transistors are connected together.

13. A digital-to-analog converter according to claim 12 wherein said current source is connected to said emitters of said pair of bipolar current switching transistors.

14. A digital-to-analog converter comprising:
    digital input means for accepting a plurality of digital input signals;
    at least one output current summing bus; and
    a plurality of current cells connected to said digital input means and said at least one output current summing bus, at least one of said current cells comprising
       a current source,
       a pair of bipolar current switching transistors connected to said current source and said at least one output current summing bus in a current steering configuration so that one transistor is off while the other transistor is on, said pair of bipolar current switching transistors having a proportion of current steering based upon a difference in base-emitter voltages and also based upon a thermal voltage,
       a proportional to absolute temperature (PTAT) source, and
       a pair of steering transistors connected to said PTAT source and said pair of bipolar current switching transistors for controlling the difference in base-emitter voltages of said bipolar current switching transistors based upon the PTAT source to provide a predetermined proportion of current steering over a relatively wide temperature range to thereby compensate for the thermal voltage.

15. A digital-to-analog converter according to claim 14 further comprising a buffer stage connected between said pair of steering transistors and said pair of bipolar current switching transistors.

16. A digital-to-analog converter according to claim 15 wherein said buffer stage comprises a pair of buffer transistors and associated constant current sources connected thereto.

17. A digital-to-analog converter according to claim 14 wherein the plurality of current cells are arranged in a split architecture with a first group of current cells for a first number of least significant bits and a second group of current cells for a second number of most significant bits.

18. A digital-to-analog converter according to claim 17 further comprising a resistor network connected between the first group of current cells and the at least one current summing bus.

19. A digital-to-analog converter according to claim 17 wherein said digital input means comprises:

a master register receiving the digital input signals;

a data buffer and level shifter connected to said master register; and a slave register connected between said data buffer and level shifter and said plurality of current cells.

20. A digital-to-analog converter according to claim 19 wherein said digital input means further comprises a decoder connected between said data buffer and level shifter and said slave register for the second group of current cells for the second number of most significant bits.

21. A digital-to-analog converter according to claim 14 wherein the emitters of said pair of bipolar current switching transistors are connected together.

22. A digital-to-analog converter according to claim 14 wherein said current source is connected to said emitters of said pair of bipolar current switching transistors.

23. A current cell comprising:

a current source;

a pair of bipolar current switching transistors connected in a current steering configuration so that one transistor is off while the other transistor is on, said pair of bipolar current switching transistors having a proportion of current steering based upon a difference in base-emitter voltages and also based upon a thermally dependent voltage; and temperature compensated control means for controlling the difference in base-emitter voltages of said bipolar current switching transistors based upon a temperature dependent bias voltage to compensate for the thermally dependent voltage, said temperature compensated control means comprising a proportional to absolute temperature (PTAT) current source, and a pair of steering transistors and associated bias resistors connected to said PTAT current source and said pair of bipolar current switching transistors for controlling the difference in base-emitter voltages of said bipolar current switching transistors based upon absolute temperature.

24. A current cell according to claim 23 wherein said temperature compensated control means comprises means for controlling the difference in base-emitter voltages of said bipolar current switching transistors to provide a predetermined ratio of current steering over a relatively wide temperature range.

25. A current cell according to claim 23 wherein the emitters of said pair of bipolar current switching transistors are connected together.

26. A method of steering current in a current cell of a plurality of such current cells connected to an output current summing bus of a digital-to-analog converter, each current cell comprising a pair of current switching transistors connected together in a current steering configuration so that one transistor is off while the other transistor is on, the pair of current switching transistors having a proportion of current steering based upon a difference in transistor control voltages and also based upon a thermally dependent voltage, the method comprising the steps of:

receiving at least one digital input signal;

supplying a current to the pair of current switching transistors for steering based upon the digital input signal; and controlling the difference in transistor control voltages of the current switching transistors based upon a temperature dependent bias voltage to compensate for the thermally dependent voltage.

27. A method according to claim 26 wherein the step of controlling comprises controlling the difference in transistor control voltages of said current switching transistors to provide a predetermined ratio of current steering over a relatively wide temperature range.

28. A method according to claim 26 wherein the step of controlling comprises controlling the difference in transistor control voltages based upon a source having a predetermined output as a function of temperature to compensate for the thermally dependent voltage.

29. A method according to claim 26 wherein the step of controlling comprises controlling the difference in transistor control voltages based upon a proportional-to-absolute temperature (PTAT) source.

30. A method according to claim 26 wherein the step of controlling further comprises controlling the difference in transistor control voltages temperature using a pair of steering transistors connected to the pair of current switching transistors.

* * * * *